United States Patent
Niimura et al.

(10) Patent No.: US 10,509,079 B2
(45) Date of Patent: Dec. 17, 2019

(54) INVERTER TEST APPARATUS

(71) Applicant: TOSHIBA MITSUBISHI-ELECTRICAL INDUSTRIAL SYSTEMS CORPORATION, Chuo-ku (JP)

(72) Inventors: Naoto Niimura, Tokyo (JP); Toshiaki Oka, Tokyo (JP); Hiromitsu Suzuki, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 352 days.

(21) Appl. No.: 15/258,571

(22) Filed: Sep. 7, 2016

(65) Prior Publication Data
US 2016/0377687 A1 Dec. 29, 2016

Related U.S. Application Data

(63) Continuation of application No. PCT/JP2014/055995, filed on Mar. 7, 2014.

(51) Int. Cl.
*G01R 31/42* (2006.01)
*H02M 7/487* (2007.01)
*H02M 5/45* (2006.01)

(52) U.S. Cl.
CPC .......... *G01R 31/42* (2013.01); *H02M 7/487* (2013.01); *H02M 5/45* (2013.01)

(58) Field of Classification Search
None
See application file for complete search history.

(56) References Cited

U.S. PATENT DOCUMENTS

| 5,969,957 A * | 10/1999 | Divan | H02M 5/458 318/768 |
| 2007/0147098 A1* | 6/2007 | Mori | H02J 3/01 363/71 |
| 2010/0036555 A1* | 2/2010 | Hosoda | B60L 3/003 701/22 |

FOREIGN PATENT DOCUMENTS

| JP | 11-285265 | 10/1999 |
| JP | 2000-69765 | 3/2000 |
| JP | 2004-104891 | 4/2004 |

(Continued)

OTHER PUBLICATIONS

English Translation of JP 2008-167655 A, Jul. 17, 2008 (Year: 2008).*

(Continued)

*Primary Examiner* — Paresh Patel
(74) *Attorney, Agent, or Firm* — Oblon, McClelland, Maier & Neustadt, L.L.P.

(57) ABSTRACT

An inverter test apparatus includes a DC power supply, a second inverter which is connected to a DC side of the first inverter, an inductor which is connected between an AC side of the first inverter and an AC side of the second inverter, a first controller which controls an AC voltage of the first inverter to be at a constant amplitude and a constant frequency, a current detector which detects a current that flows through the inductor, a phase command value computation module which computes a phase command value of the second inverter so as to control the current detected by the current detector, and a second controller which controls a phase of the second inverter, based on the phase command value computed.

6 Claims, 4 Drawing Sheets

(56) References Cited

FOREIGN PATENT DOCUMENTS

JP          2008-167655 A      7/2008

OTHER PUBLICATIONS

English Translation of JP 2008-167655 (Year: 2008).*
Engish Translation of JP 2000-069765 (Year: 2000).*
Office Action dated Mar. 5, 2018 in Chinese Patent Application No. 201480061522.0 (Partial English machine translation of the Chinese Office Action only).
Combined Chinese Office Action and Search Report dated Mar. 5, 2018 in Patent Application No. 201480061522.0 (with English language translation of categories of cited documents).
Extended European Search Report dated Oct. 17, 2017 in Patent Application No. 14884779.1.
Office Action dated Mar. 22, 2019 in Indian Patent Application No. 201647033669 (with English translation).
Office Action dated Nov. 21, 2018 in Chinese Patent Application No. 201480061522.0 (with unedited computer generated English translation).
Office Action dated Jun. 4, 2019 in Chinese Application No. 201480061522.0, along with a partial English machine translation.
International Search Report dated Jun. 3, 2014 in PCT/JP2014/055995, filed on Mar. 7, 2014 (with English Translation).
Written Opinion dated Jun. 3, 2014 in PCT/JP2014/055995, filed on Mar. 7, 2014.

* cited by examiner

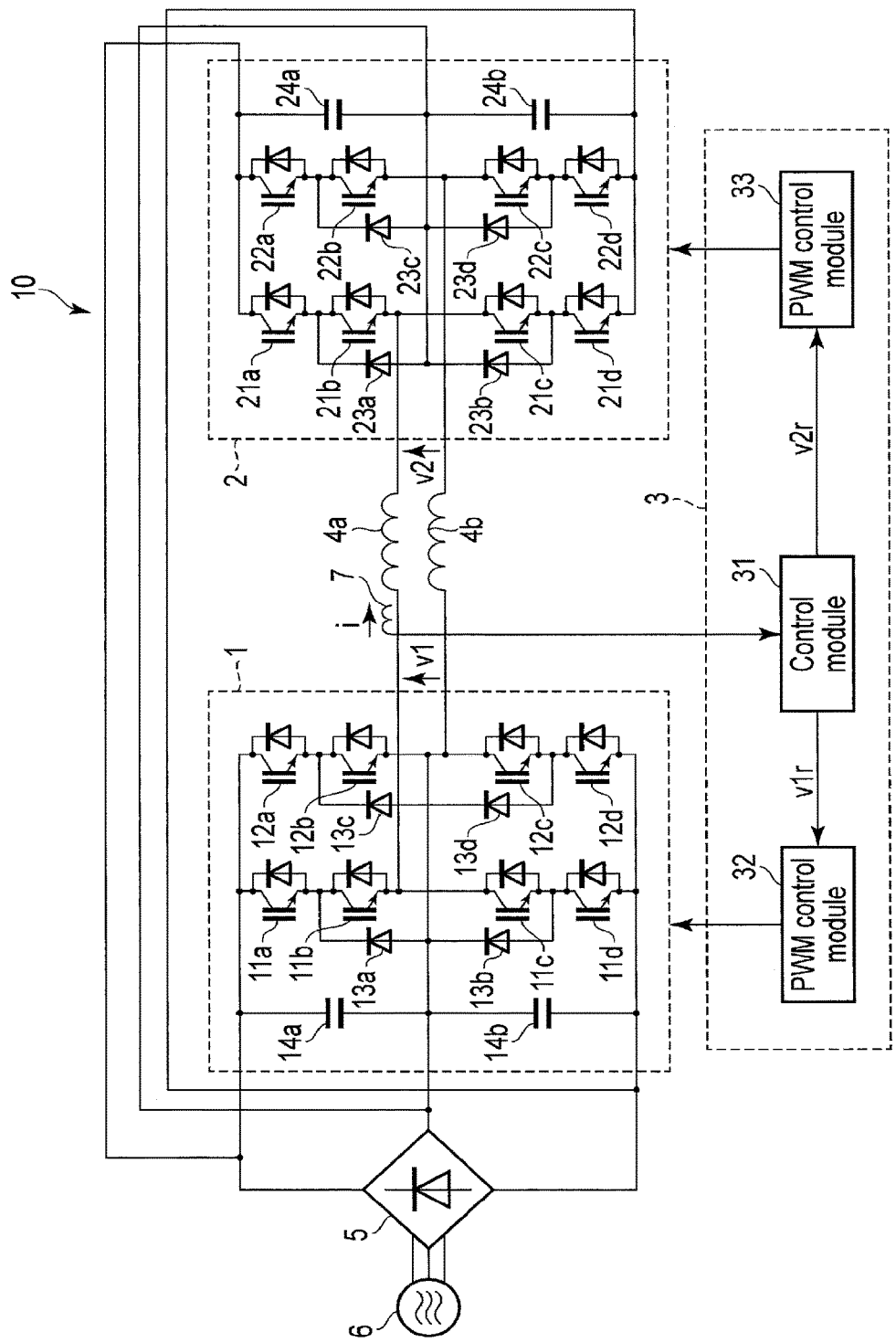
F I G. 1

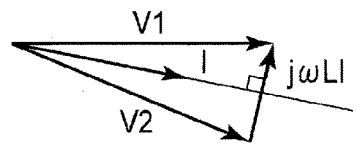
F I G. 4
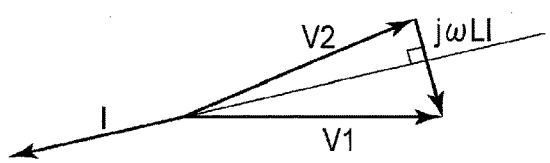
F I G. 5
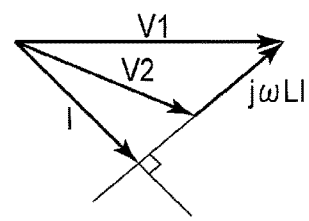
F I G. 6
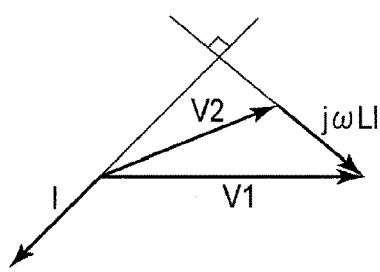
F I G. 7

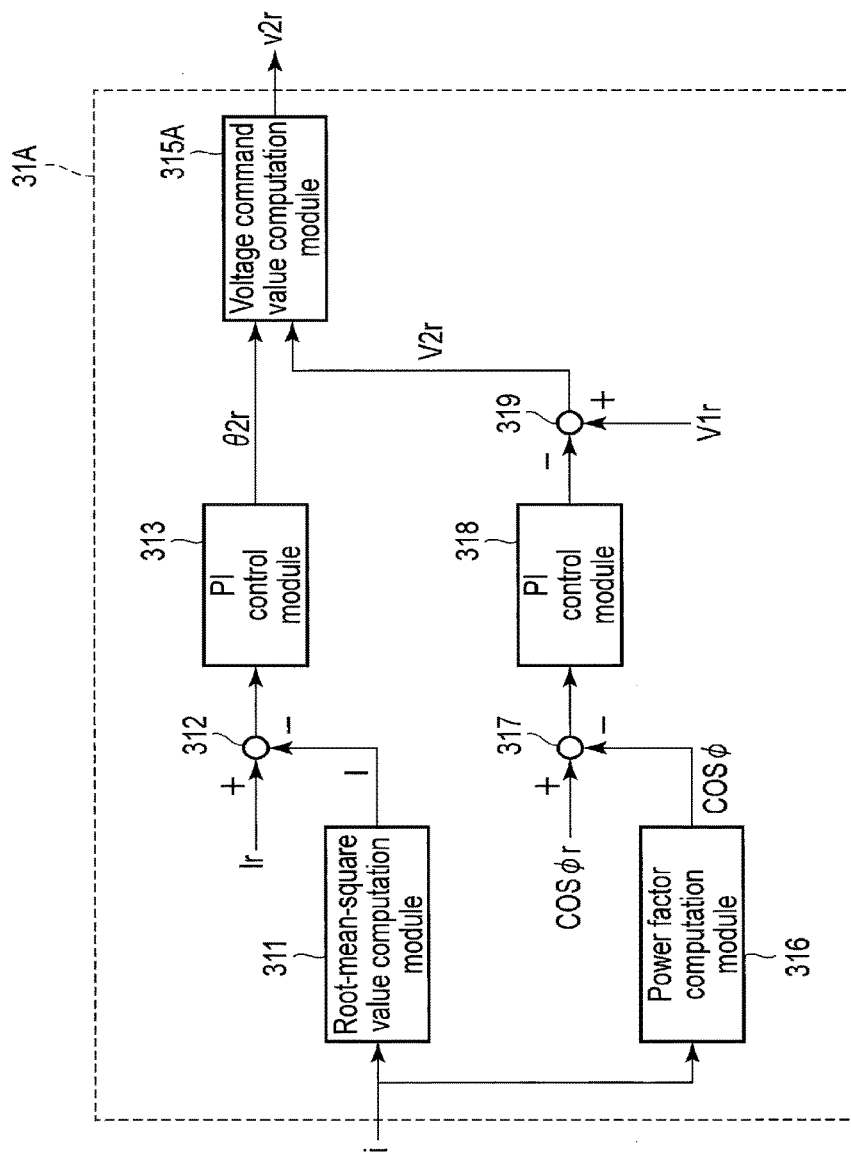
F I G. 8

INVERTER TEST APPARATUS

CROSS REFERENCE TO RELATED APPLICATIONS

This application is a Continuation application of PCT Application No. PCT/JP2014/055995, filed Mar. 7, 2014, the entire contents of which are incorporated herein by reference.

BACKGROUND OF THE INVENTION

1. Field of the Invention

The present invention relates to an inverter test apparatus which tests an inverter.

2. Description of the Related Art

Generally, various methods for testing inverters are known.

For example, one method is to test an inverter by connecting an alternating-current (AC) power supply to an AC side of the inverter to be tested. Also, in a method of testing a self-commutated converter in which a reactor is connected to a load side of a single-phase inverter, there is a disclosure that an arbitrary phase of the single-phase inverter is set to be a switching state in a predetermined operational state, and a phase and an amplitude are adjusted such that a phase of a current of the remaining phase becomes −180° to 180° with respect to a voltage of the aforementioned arbitrary phase (refer to Patent Literature 1).

However, if an AC power supply is connected to the AC side of the inverter, costs required for a test apparatus will increase. Further, if an AC power supply is not connected to the AC side of the inverter, it becomes difficult to test the inverter under a normal energization condition. For example, in the aforementioned test method, a test will be conducted under a special energization condition that one of two legs which constitute a power conversion circuit works as a power running side, and the other leg works as a regeneration side.

CITATION LIST

Patent Literature

Patent Literature 1: JPH11-285265 A

BRIEF SUMMARY OF THE INVENTION

An object of the present invention is to provide an inverter test apparatus capable of testing an inverter in an energization condition close to the actual condition.

In accordance with an aspect of the present invention, there is provided an inverter test apparatus configured to test a first single-phase inverter. The inverter test apparatus comprises a DC power supply configured to supply a DC power to the first single-phase inverter; a second single-phase inverter which is connected to a DC side of the first single-phase inverter; an inductor which is connected between an AC side of the first single-phase inverter and an AC side of the second single-phase inverter; a first controller configured to control an AC voltage of the first single-phase inverter to be at a constant amplitude and a constant frequency; a current detector configured to detect a current which flows through the inductor; a phase command value computation module configured to compute a phase command value of the second single-phase inverter so as to control the current detected by the current detector; and a second controller configured to control a phase of the second single-phase inverter, based on the phase command value computed by the phase command value computation module.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a configuration diagram showing a configuration of an inverter test apparatus according to a first embodiment of the present invention.

FIG. 4 is a phasor diagram at the time of power running when V1$r$ is equal to V2$r$ in the test circuit of the inverter according to the first embodiment.

FIG. 5 is a phasor diagram at the time of regeneration when V1$r$ is equal to V2$r$ in the test circuit of the inverter according to the first embodiment.

FIG. 6 is a phasor diagram at the time of power running when V1$r$ is greater than V2$r$ in the test circuit of the inverter according to the first embodiment.

FIG. 7 is a phasor diagram at the time of regeneration when V1$r$ is greater than V2$r$ in the test circuit of the inverter according to the first embodiment.

FIG. 8 is a configuration diagram showing a configuration of a control module according to a second embodiment of the present invention.

Figure 2:
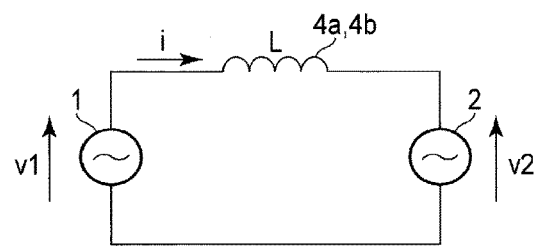
FIG. 2 is a circuit diagram showing an equivalent circuit of a test circuit of an inverter according to the first embodiment.

DETAILED DESCRIPTION OF THE INVENTION (First Embodiment)

FIG. 1 is a configuration diagram showing a configuration of an inverter test apparatus 10 according to a first embodiment of the present invention. It should be noted that in each of the figures, portions identical to those in the other figures will be denoted by the same reference numbers as in the other figures, and duplicated descriptions will be omitted as necessary and different parts will be mainly described.

The inverter test apparatus 10 is an apparatus for testing an inverter 1. The inverter test apparatus 10 comprises a test facility inverter 2, a controller 3, two inductors 4$a$ and 4$b$, a diode rectifier 5, an AC power supply 6, and a current detector 7.

The inverter 1 is a single-phase inverter, and is a neutral-point clamped three-level inverter. The inverter 1 is subjected to pulse width modulation (PWM) control, thereby performing a power conversion operation.

The inverter 1 comprises eight switching elements 11a, 11b, 11c, 11d, 12a, 12b, 12c, and 12d, four neutral-point clamp diodes 13a, 13b, 13c, and 13d, and two capacitors 14a and 14b. A reflux diode is connected to each of the eight switching elements 11a to 11d, and 12a to 12d.

The eight switching elements 11a to 11d, and 12a to 12d constitute two legs. A first leg is a structure that four switching elements 11a to 11d are connected in series. The switching elements 11a to 11d are positioned in the order of switching elements 11a, 11b, 11c, and 11d from the positive electrode side. A second leg is a structure that four switching elements 12a to 12d are connected in series. The switching elements 12a to 12d are positioned in the order of switching elements 12a, 12b, 12c, and 12d from the positive electrode side. The first leg and the second leg are connected in parallel. The two capacitors 14a and 14b connected in series are connected in parallel with the two legs. A connection point between the two switching elements 11b and 11c located at the center of the first leg, and a connection point between the two switching elements 12b and 12c located at the center of the second leg constitute a single-phase AC side terminal of the inverter 1.

The two neutral-point clamp diodes 13a and 13b, which are connected in series, are connected in such a way to connect a connection point between the two switching elements 11a and 11b positioned on the positive electrode side of the first leg and a connection point between the two switching elements 11c and 11d positioned on the negative electrode side of the first leg. A cathode side of the neutral-point clamp diodes 13a and 13b is connected to the positive electrode side, and an anode side of the same is connected to the negative electrode side.

The two neutral-point clamp diodes 13c and 13d, which are connected in series, are connected in such a way to connect a connection point between the two switching elements 12a and 12b positioned on the positive electrode side of the second leg and a connection point between the two switching elements 12c and 12d positioned on the negative electrode side of the second leg. A cathode side of the neutral-point clamp diodes 13c and 13d is connected to the positive electrode side, and an anode side of the same is connected to the negative electrode side.

The connection point between the two switching elements 12b and 12c located at the center of the second leg, a connection point between the two neutral-point clamp diodes 13a and 13b provided in the first leg, and a connection point between the two capacitors 14a and 14b are short-circuited as a neutral point of voltage. The positive electrode side of the two legs serves as a positive terminal, and the negative electrode side of the two legs serves as a negative terminal.

The diode rectifier 5 is connected to a direct-current (DC) side of the inverter 1 at three points, which are the positive terminal, a neutral point terminal, and the negative terminal. The diode rectifier 5 is a DC power supply which supplies DC power to the inverter 1. The diode rectifier 5 converts three-phase AC power supplied from the AC power supply 6 into a DC power, and outputs the converted DC power to the inverter 1. The AC power supply 6 is, for example, a commercial power supply. Note that a device such as a power generator, a battery, or a power converter may be provided instead of the diode rectifier 5 and the AC power supply 6, as long as it outputs a DC power.

The test facility inverter 2 is a single-phase inverter, and is a neutral-point clamped three-level inverter. The test facility inverter 2 is PWM-controlled, thereby performing a power conversion operation. As the inverter 1 is connected to the inverter test apparatus 10, a DC side of the test facility inverter 2 is connected to the DC side of the inverter 1. Further, since the test facility inverter 2 has a structure similar to the structure of the inverter 1 to be tested, a description of the details will be omitted.

The test facility inverter 2 comprises eight switching elements 21a, 21b, 21c, 21d, 22a, 22b, 22c, and 22d, four neutral-point clamp diodes 23a, 23b, 23c, and 23d, and two capacitors 24a and 24b. A reflux diode is connected to each of the eight switching elements 21a to 21d, and 22a to 22d.

A third leg is structured by four switching elements 21a to 21d. A fourth leg is structured by four switching elements 22a to 22d. The third leg, the fourth leg, and the two capacitors 24a and 24b which are connected in series are connected in parallel. A connection point between the two switching elements 21b and 21c located at the center of the third leg, and a connection point between the two switching elements 22b and 22c located at the center of the fourth leg constitute a single-phase AC side terminal of the inverter 2. A connection point between the two neutral-point clamp diodes 23a and 23b provided in the third leg, a connection point between the two neutral-point clamp diodes 23c and 23d provided in the fourth leg, and a connection point between the two capacitors 24a and 24b are short-circuited as a neutral point of voltage. The positive electrode side of the two legs serves as a positive terminal, and the negative electrode side of the two legs serves as a negative terminal.

A connection point between the two switching elements 11b and 11c located at the center of the first leg of the inverter 1, and a connection point between the two switching elements 21b and 21c located at the center of the third leg of the test facility inverter 2 are connected via the inductor 4a. A connection point between the two switching elements 12b and 12c located at the center of the second leg of the inverter 1, and a connection point between the two switching elements 22b and 22c located at the center of the fourth leg of the test facility inverter 2 are connected via the inductor 4b. The DC side of the inverter 1 and the DC side of the test facility inverter 2 are connected to each other by each of the positive electrode, the neutral point, and the negative electrode.

The current detector 7 is provided on a wire on which the inductor 4a is provided at a side that is closer to the inverter 1 than from the inductor 4a. The current detector 7 detects a conducting current i which flows through the inductor 4a, and outputs the conducting current i to the controller 3.

The controller 3 is an apparatus which controls the inverter 1 and the test facility inverter 2. The controller 3 comprises a control module 31, a PWM control module 32, and a PWM control module 33. The control module 31 performs control based on the conducting current i detected by the current detector 7. The control module 31 computes a voltage command value v1r for the inverter 1 and a voltage command value v2r for the test facility inverter 2. The PWM control module 32 PWM-controls the inverter 1 in accordance with the voltage command value v1r for the inverter 1 computed by the control module 31. The PWM control module 33 PWM-controls the test facility inverter 2 in accordance with the voltage command value v2r for the test facility inverter 2 computed by the control module 31. In this way, an energization test of the inverter 1 is carried out.

Next, control by the controller 3 will be described.

FIG. 2 is a circuit diagram showing an equivalent circuit of a test circuit of the inverter 1. L represents the inductance of the inductors 4a and 4b.

The controller 3 controls a single-phase AC voltage v1 of the inverter 1 and a single-phase AC voltage v2 of the test facility inverter 2. The voltage command value v1r for the inverter 1 and the voltage command value v2r for the test facility inverter 2 are given as shown in the following equations:

$$v1r = V1r \times \cos(\omega r \cdot t) \quad (1)$$

$$v2r = V2r \times \cos(\omega r \cdot t + \theta 2r) \quad (2)$$

Here, V1r and V2r are voltage amplitude command values, ωr is the angular velocity command value, and θ2r is the phase command value.

The controller 3 controls an alternating voltage of the inverter 1 to have a constant amplitude and a constant frequency irrespective of the conducting current i. The controller 3 performs current control by controlling the amplitude of the alternating voltage of the test facility inverter 2 to be basically constant, and changing the phase command value θ2r by the conducting current i.

Figure 3:
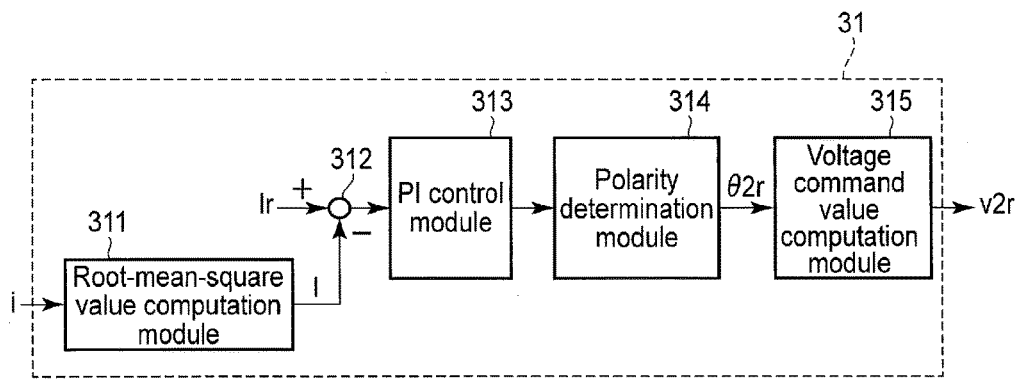
FIG. 3 is a configuration diagram showing a configuration of a control module of a controller according to the first embodiment.

FIG. 3 is a configuration diagram showing a configuration of the control module 31 of the controller 3.

The control module 31 comprises a root-mean-square value computation module 311, a subtracter 312, a proportional-plus-integral control (PI) control module 313, a polarity determination module 314, and a voltage command value computation module 315.

The root-mean-square value computation module 311 computes a root-mean-square value from the conducting current i (instantaneous value) detected by the current detector 7. The root-mean-square value computation module 311 outputs a conducting current amplitude I obtained from the root-mean-square value to the subtracter 312.

The subtracter 312 subtracts the conducting current amplitude I computed by the root-mean-square value computation module 311 from a preset current amplitude command value Ir. The subtracter 312 outputs a result of computation to the PI control module 313. The PI control module 313 performs proportional-plus-integral control such that the result of computation by the subtracter 312 becomes zero. That is, the PI control module 313 controls the conducting current amplitude I to follow the current amplitude command value Ir. The PI control module 313 outputs a result of computation to the polarity determination module 314.

The polarity determination module 314 multiplies the result of computation by the PI control module 313 by a coefficient K which determines the polarity. When a power running test of the inverter 1 is to be performed, the coefficient K is set to 1. When a regenerative test of the inverter 1 is to be performed, the coefficient K is set to −1. The polarity determination module 314 outputs a result of computation as the phase command value θ2r to the voltage command value computation module 315. A set value of the coefficient K may be switched automatically in accordance with a test schedule determined in advance, or switched manually.

The voltage command value computation module 315 computes the voltage command value v2r for the test facility inverter 2 by using equation (2) based on the phase command value θ2r computed by the polarity determination module 314. The voltage command value computation module 315 outputs the computed voltage command value v2r to the PWM control module 33 that controls the test facility inverter 2.

Next, a principle of control by the controller 3 will be described. FIGS. 4 to 7 are phasor diagrams according to a test condition of a test circuit of the inverter 1.

FIG. 4 is a phasor diagram at the time of power running when V1r is equal to V2r. FIG. 5 is a phasor diagram at the time of regeneration when V1r is equal to V2r. The conducting current amplitude I is determined by a vector difference between voltage v1 of the inverter 1 and voltage v2 of the test facility inverter 2. From FIGS. 4 and 5, in the power running state, the more the phase lags, the greater the conducting current amplitude I becomes, and in the regenerative state, the more the phase leads, the greater the conducting current amplitude I becomes. Accordingly, by the polarity determination module 314, the polarity is changed at the time of power running and regeneration.

Although FIGS. 4 and 5 show cases where V1r is equal to V2r (V1r=V2r), by making V1r greater than V2r (V1r>V2r), the power factor of the conducting current i can be changed.

FIG. 6 is a phasor diagram at the time of power running when V1r is greater than V2r. FIG. 7 is a phasor diagram at the time of regeneration when V1r is greater than V2r. While the power factor becomes a lagging power factor at the time of power running, and becomes a leading power factor at the time of regeneration, as compared to the case where V1r is equal to V2r, a rated current at a reduced power factor is obtained. That is, the figures show that for the inverter 1 to be tested, by reducing the voltage amplitude command value V2r for the test facility inverter 2, a power running or regenerative test of the rated current is enabled at a rated voltage of an arbitrary power factor.

According to the present embodiment, by changing the phase of the test facility inverter 2 based on the conducting current i which flows through the inductor 4a, in the energization test of the rated current performed at the rated voltage of the inverter 1, switching of the power running and regeneration, and the power factor adjustment can be carried out.

Also, in a test by the inverter test apparatus 10, since the conducting current i is circulated between the inverter 1 and the test facility inverter 2, the diode rectifier 5 may supply an amount which is sufficient to compensate for a loss.

Further, since the inverter 1 and the test facility inverter 2 are both a single-phase inverter, in order to carry out the test, current control of a single-phase circuit is necessary. Accordingly, current control of a three-phase circuit using a general d-q transformation cannot be performed. On the other hand, the controller 3 can perform current control with the single-phase circuit by using only the conducting current i as the feedback amount. For example, even if the inverter 1 is one of three units which constitute the three-phase inverter circuit, the inverter 1 can be tested alone by the single-phase circuit.

(Second Embodiment)

FIG. 8 is a configuration diagram showing a configuration of a control module 31A according to a second embodiment of the present invention.

An inverter test apparatus 10 according to the present embodiment is one in which the control module 31 of the controller 3 shown in FIG. 3 of the first embodiment is replaced by the control module 31A. The other points are similar to the first embodiment.

The control module 31A is structured by removing the polarity determination module 314 from the control module 31 according to the first embodiment, replacing the voltage command value computation module 315 with a voltage command value computation module 315A, and adding a power factor value computation module 316, a subtracter 317, a PI control module 318, and a subtracter 319. The other points are similar to the control module 31 of the first embodiment.

As regards a method of computing a phase command value θ2r in the control module 31A, multiplication by coefficient K by the polarity determination module 314 as performed in the first embodiment is not required, and an output of a PI control module 313 is directly treated as the phase command value θ2r. The computed phase command value θ2r is input to the voltage command value computation module 315A.

Next, a method of computing a voltage amplitude command value V2r for a test facility inverter 2 by the control module 31A will be described.

A conducting current i detected by a current detector 7 is input to the power factor computation module 316. The power factor computation module 316 computes a power factor cos φ by a function determined in advance based on the conducting current i. The computed power factor cos φ is treated as a measured value of the current power factor. The power factor computation module 316 outputs the computed power factor cos φ to the subtracter 317. In the above, while the power factor computation module 316 obtains the power factor by only the conducting current i, the power factor may be obtained by detecting a voltage v1 of an inverter 1.

The subtracter 317 subtracts the power factor cos φ computed by the power factor computation module 316 from a preset power factor command value cos φr. The subtracter 317 outputs a result of computation to the PI control module 318. The PI control module 318 performs proportional-plus-integral control such that the result of computation by the subtracter 312 becomes zero. That is, the PI control module 318 controls the power factor cos φ to follow the power factor command value cos φ r. The PI control module 318 outputs a result of computation to the subtracter 319. The subtracter 319 subtracts the result of computation by the PI control module 318 from a voltage amplitude command value V1r for the inverter 1 set in advance. The subtracter 319 outputs a result of computation to the voltage command value computation module 315A as the voltage amplitude command value V2r for the test facility inverter 2.

The phase command value θ2r computed by the PI control module 313, and the voltage amplitude command value V2r computed by the subtracter 319 are input to the voltage command value computation module 315A. The voltage command value computation module 315A computes a voltage command value v2r for the test facility inverter 2 by using equation (2) based on the voltage amplitude command value V2r and the phase command value θ2r. The voltage command value computation module 315A outputs the computed voltage command value v2r to a PWM control module 33 which controls the test facility inverter 2.

According to the present embodiment, in addition to the effect and advantage of the first embodiment, an energization test can be carried out such that the power factor cos φ follows the power factor command value cos φr. For example, by creating a program whereby the power factor command value cos φr is changed over time, a test in which the power factor cos φ changes over time can be carried out.

Note that while the polarity determination module 314 is provided in the controller 3 in the first embodiment, if only one of the power running test and the regenerative test is to be carried out, the polarity determination module 314 may be omitted.

The inverter 1 and the test facility inverter 2 are not limited to ones described in the above embodiments. That is, any kind of inverter may be used as long as it is a single-phase inverter.

In each of the embodiments, the parameters set in advance can be set or changed in accordance with the test conditions. These parameters may be allowed to be updated automatically or updated manually in accordance with a predetermined test schedule.

It is to be noted that the present invention is not restricted to the foregoing embodiments, and constituent elements can be modified and changed into shapes without departing from the scope of the invention at an embodying stage. Additionally, various inventions can be formed by appropriately combining a plurality of constituent elements disclosed in the foregoing embodiments. For example, several constituent elements may be eliminated from all constituent elements disclosed in the embodiments. Furthermore, constituent elements in the different embodiments may be appropriately combined.

What is claimed is:

1. An inverter test apparatus configured to test a first single-phase inverter, the inverter test apparatus comprising:
    a DC power supply configured to supply a DC power to the first single-phase inverter;
    a second single-phase inverter which is connected to a DC side of the first single-phase inverter;
    an inductor which is connected between an AC side of the first single-phase inverter and an AC side of the second single-phase inverter;
    a first controller configured to control an AC voltage of the first single-phase inverter to be at a constant amplitude and a constant frequency;
    a current detector configured to detect a current which flows through the inductor;
    a phase command value computation module configured to compute a phase command value of the second single-phase inverter so as to follow the current detected by the current detector to a current amplitude command value; and
    a second controller configured to control a phase of the second single-phase inverter, based on the phase command value computed by the phase command value computation module,
    wherein the phase command value computation module computes a root-mean-square value from the current detected by the current detector, computes a conducting current amplitude from the root-mean-square value, subtracts the conducting current amplitude from the current amplitude command value, performs a proportional-plus-integral control such that a result of subtraction becomes zero, and computes the phase command value from a result of the proportional-plus-integral control.

2. The inverter test apparatus of claim 1, wherein the phase command value computation module is configured to change a polarity of the phase command value at the time of power running and regeneration of the first single-phase inverter.

3. The inverter test apparatus of claim 1, further comprising a voltage amplitude command value computation module configured to compute a voltage amplitude command value of the second single-phase inverter so as to control a power factor of the first single-phase inverter, based on the current detected by the current detector, wherein
    the second controller is configured to control a voltage amplitude of the second single-phase inverter, based on the voltage amplitude command value computed by the voltage amplitude command value computation module.

4. The inverter test apparatus of claim 2, further comprising a voltage amplitude command value computation module configured to compute a voltage amplitude command value of the second single-phase inverter so as to control a power factor of the first single-phase inverter, based on the current detected by the current detector, wherein
the second controller is configured to control a voltage amplitude of the second single-phase inverter, based on the voltage amplitude command value computed by the voltage amplitude command value computation module.

5. An inverter testing method for testing a first single-phase inverter, the method comprising:
connecting a second single-phase inverter to a DC side of the first single-phase inverter;
connecting an inductor between an AC side of the first single-phase inverter and an AC side of the second single-phase inverter;
controlling an AC voltage of the first single-phase inverter to be at a constant amplitude and a constant frequency;
detecting a current which flows through the inductor;
computing a phase command value of the second single-phase inverter so as to follow the detected current to a current amplitude command value; and
controlling a phase of the second single-phase inverter, based on the computed phase command value,
wherein computing the phase command value includes computing a root-mean-square value from the detected current, computing a conducting current amplitude from the root-mean-square value, subtracting the conducting current amplitude from the current amplitude command value, performing a proportional-plus-integral control such that a result of subtraction becomes zero, and computing the phase command value from a result of the proportional-plus-integral control.

6. A controller for an inverter test apparatus in which a second single-phase inverter is connected to a DC side of a first single-phase inverter, and an inductor is connected between an AC side of the first single-phase inverter and an AC side of the second single-phase inverter, and which tests the first single-phase inverter, the controller comprising:
a first controller configured to control an AC voltage of the first single-phase inverter to be at a constant amplitude and a constant frequency;
a current detector configured to detect a current which flows through the inductor;
a phase command value computation module configured to compute a phase command value of the second single-phase inverter so as to follow the current detected by the current detector to a current amplitude command value; and
a second controller configured to control a phase of the second single-phase inverter, based on the phase command value computed by the phase command value computation module,
wherein the phase command value computation module computes a root-mean-square value from the current detected by the current detector, computes a conducting current amplitude from the root-mean-square value, subtracts the conducting current amplitude from the current amplitude command value, performs a proportional-plus-integral control such that a result of subtraction becomes zero, and computes the phase command value from a result of the proportional-plus-integral control.

* * * * *